United States Patent
Han et al.

(10) Patent No.: US 9,942,986 B1
(45) Date of Patent: Apr. 10, 2018

(54) SYSTEM WITH FIELD-ASSISTED CONDUCTIVE ADHESIVE BONDS

(71) Applicant: Apple Inc., Cupertino, CA (US)

(72) Inventors: Koohee Han, Cupertino, CA (US); Hui Chen, Cupertino, CA (US); Kuo-Hua Sung, San Jose, CA (US); Cyrus Y. Liu, Cupertino, CA (US); To C. Tan, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/400,677

(22) Filed: Jan. 6, 2017

Related U.S. Application Data

(60) Provisional application No. 62/399,168, filed on Sep. 23, 2016.

(51) Int. Cl.
| | |
|---|---|
| *H05K 1/14* | (2006.01) |
| *H05K 1/02* | (2006.01) |
| *H05K 1/11* | (2006.01) |
| *H05K 1/09* | (2006.01) |
| *H05K 3/10* | (2006.01) |
| *H05K 3/36* | (2006.01) |
| *H05K 3/38* | (2006.01) |

(52) U.S. Cl.
CPC ............. *H05K 1/144* (2013.01); *H05K 1/028* (2013.01); *H05K 1/09* (2013.01); *H05K 1/11* (2013.01); *H05K 3/10* (2013.01); *H05K 3/365* (2013.01); *H05K 3/38* (2013.01); *H05K 2201/041* (2013.01); *H05K 2203/10* (2013.01)

(58) Field of Classification Search
CPC .......... H05K 1/144; H05K 1/028; H05K 1/11; H05K 3/10; H05K 3/365; H05K 3/38; H05K 1/09

USPC .......................................... 361/749; 174/260
See application file for complete search history.

(56) References Cited

U.S. PATENT DOCUMENTS

| | | | | |
|---|---|---|---|---|
| 6,518,091 | B1 * | 2/2003 | Haba ...................... | B29C 70/62 204/164 |
| 7,081,675 | B2 | 7/2006 | Yim et al. | |
| 7,492,434 | B2 * | 2/2009 | Kudo .................. | G02F 1/13452 349/149 |
| 7,504,331 | B2 | 3/2009 | Fork et al. | |
| 7,662,708 | B2 | 2/2010 | Fork et al. | |

(Continued)

OTHER PUBLICATIONS

Demirors et al., Periodically microstructured composite films made by electric- and magnetic-directed colloidal assembly, PNAS, Apr. 26, 2016, vol. 113, No. 17, pp. 4623-4628.

*Primary Examiner* — Timothy Thompson
*Assistant Examiner* — Charles Pizzuto
(74) *Attorney, Agent, or Firm* — Treyz Law Group, P.C.; G. Victor Treyz; David K. Cole

(57) ABSTRACT

Components may have substrates with metal traces that form mating contacts. The components may be bonded together using anisotropic conductive adhesive bonding techniques. During bonding, conductive particles may be concentrated over the contacts by application of magnetic or electric fields or by using a template transfer process. Gaps between the contacts may be at least partially free of conductive particles to help isolate adjacent contacts. Polymer between the substrates may attach the substrates together. The conductive particles may be embedded in the polymer and crushed or melted to short opposing contacts together.

21 Claims, 8 Drawing Sheets

(56) References Cited

U.S. PATENT DOCUMENTS

| | | | |
|---|---|---|---|
| 2011/0080452 A1* | 4/2011 | Britton | B41J 2/14016 |
| | | | 347/55 |
| 2011/0088935 A1* | 4/2011 | Ishimatsu | H05K 3/323 |
| | | | 174/257 |
| 2011/0155945 A1* | 6/2011 | Soong | C08J 9/0066 |
| | | | 252/62.54 |
| 2014/0205851 A1* | 7/2014 | Mahajan | B32B 7/12 |
| | | | 428/554 |
| 2014/0312501 A1* | 10/2014 | Liang | B32B 27/16 |
| | | | 257/773 |

* cited by examiner

SYSTEM WITH FIELD-ASSISTED CONDUCTIVE ADHESIVE BONDS

This application claims the benefit of provisional patent application No. 62/399,168, filed Sep. 23, 2016, which is hereby incorporated by reference herein in its entirety.

BACKGROUND

This relates generally to electronic devices and, more particularly, to electronic devices with metal electrodes that are joined using anisotropic conductive adhesive.

Electronic devices often include components with metal electrodes. It may be desirable to form electrical connections between mating sets of metal electrodes on a pair of components. Typical anisotropic conductive adhesive bonding involves forming electrical connections between top and bottom mating electrodes while avoiding direct particle bridging between laterally adjacent electrodes. If care is not taken, however, adjacent electrodes may be shorted together when forming conductive adhesive bonds or contact resistance may be higher than desired.

SUMMARY

Components such as printed circuits, displays, touch sensors, integrated circuits, and other components may have interconnects that are bonded together using anisotropic conductive adhesive. The components may have substrates such as flexible polymer substrates, rigid substrates of polymer or glass, or other substrates. The substrates may have metal electrodes (e.g., interconnects formed from metal traces on the substrates may have contacts).

During anisotropic conductive adhesive bonding, a pair of components may be bonded together. Conductive particles may be assembled (concentrated) over the contacts in the components by application of magnetic or electric fields during bonding or by using a template transfer process. The conductive particles may be embedded in a polymer and crushed between opposing contacts to short the opposing contacts together. If desired, the conductive particles may be melted when shorting contacts together (e.g., when using conductive particles formed from low temperature solder that melts upon application of heat).

The polymer may attach the substrates of the components together. Because the conductive particles are concentrated over the contacts during bond formation, gaps between contacts will be partly or entirely free of conductive particles, thereby enhancing isolation between adjacent contacts.

DETAILED DESCRIPTION

Figure 1:
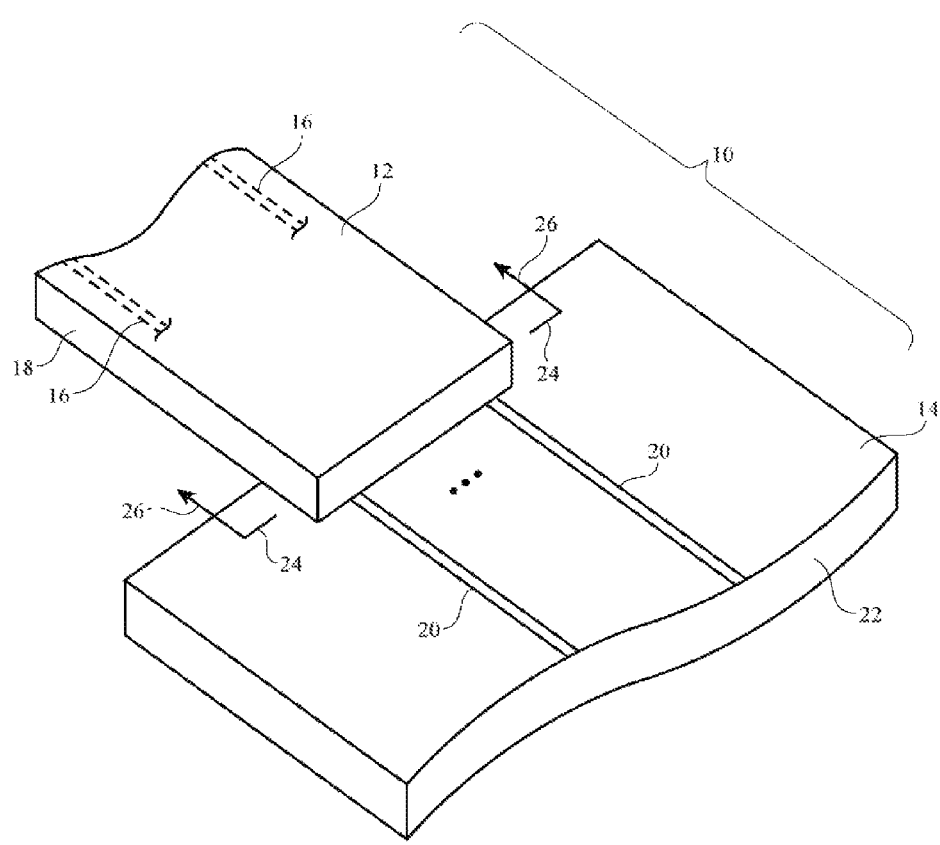
FIG. 1 is a diagram of illustrative components with contacts joined with anisotropic conductive adhesive in accordance with an embodiment.

An illustrative system having components that can be electrically coupled together is shown in FIG. 1. As shown in FIG. 1, system 10 may include a first component such as component 12 and a second component such as component 14. System 10 may include input-output circuit, control circuitry, and other components for forming an electronic device such as a cellular telephone, computer, embedded system, watch, or other electronic equipment. Components 12 and 14 may be flexible printed circuits, rigid printed circuits, glass substrates (e.g., a thin-film transistor layer in a liquid crystal display), may be touch sensor substrates (e.g., touch sensor substrates formed from a flexible polymer sheet), may be organic light-emitting diode display substrates or other display substrates (e.g., flexible display substrates formed from layers of polyimide or sheets of other flexible polymers), may include packaged and/or unpackaged integrated circuits (e.g., integrated circuit dies and/or packaged integrated circuits, system-in-package devices containing multiple integrated circuits, and/or other circuit components), and/or may include other suitable electrical components.

Component 12 may include metal traces 16 on substrate 18. Component 14 may include metal traces 20 on substrate 22. Traces 16 and 20 may have portions that form contacts (sometimes referred to as bond pads, contact pads, metal trace pads, metal traces, metal electrodes, etc.). These contacts may be electrically connected using polymer and conductive particles. The polymer may physically attach component 12 to component 14. The conductive particles may be embedded within the polymer and may be crushed between opposing contacts on substrates 18 and 22 to electrically short the opposing contacts to each other. For example, the conductive particles may short a first contact on the lower surface of substrate 18 to a mating second contact on the upper surface of substrate 22.

Any conductive particles in the gaps between adjacent contacts will not be crushed against the contacts and will tend to be physically and electrically isolated from each other by intervening polymer. To allow the density of contacts in a bonding region to be increased, the number of conductive particles that are located in the gaps between adjacent contacts can be reduced by applying electromagnetic fields to the contacts during bond formation. The applied electromagnetic fields may be, for example, static or alternating-current (AC) fields such as magnetic fields or electric fields. The conductive particles may be charged (e.g., with isotropic and/or anisotropic static electrical charge) and/or may be magnetic (e.g., due to inclusion of nickel or other magnetic material in the particles), so that the application of the fields causes the particles to concentrate over the contacts. Polymer material may be applied before and/or after the particles have been concentrated over the contacts to help attach substrates 18 and 22 together in the bond region and to help electrically isolate residual particles in the gaps between contacts.

Figure 2:
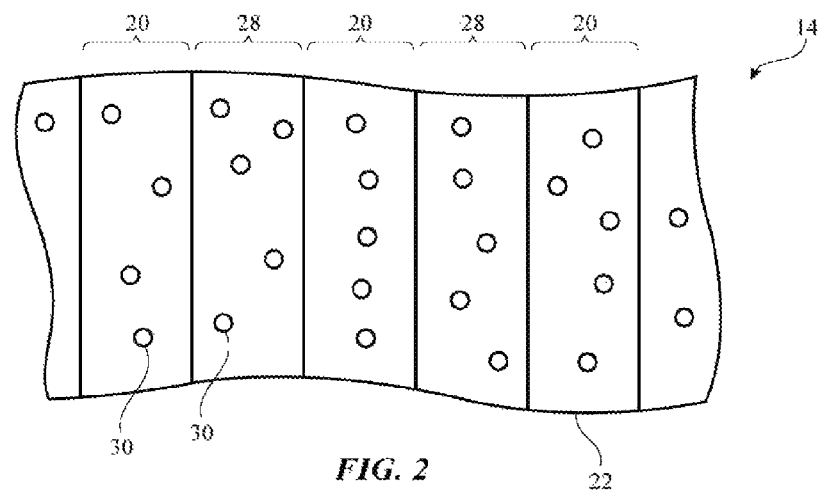
FIG. 2 is a top view of an illustrative sets of contacts and gaps between contacts following initial coverage with conductive particles in accordance with an embodiment.

Consider, as an example, a scenario in which component 14 has contacts 20 formed on an upper surface of substrate 22. As shown in FIG. 2, conductive particles 30 may initially be deposited uniformly over the surface of substrate 22. As a result, contacts 20 and gaps 28, which are formed from the exposed portions of substrate 22 between contacts 20, may be covered with similar or identical concentrations of particles 30. For example, if the density (number of particles/$cm^2$) of particles 30 over contacts 20 is DC and the density of particles 30 over gap 28 is DG, the ratio of DC to DG may be 1, may be between 0.9 and 1.1, etc.

Figure 3:
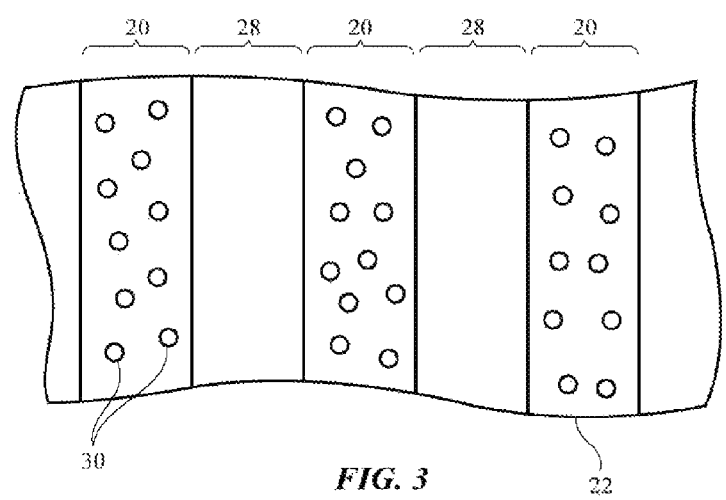
FIG. 3 is top view of the sets of contacts of FIG. 2 following application of electromagnetic fields to the conductive particles to concentrate the particles over the contacts in accordance with an embodiment.

The application of fields (magnetic and/or electric) to component 14 in the vicinity of contacts 20 may help concentrate conductive particles 30 over contacts 20. This may reduce or eliminate the possibility that laterally adjacent contacts 20 (e.g., other contacts on the surface of substrate 22 of FIG. 3) will inadvertently be shorted to each other through a chain of particles 30. The enhanced concentration of conductive particles 30 over contacts 20 may also help minimize bond resistance. In the example of FIG. 3, gaps 28 are free of conductive particles 30 following application of the fields (i.e., the ratio of DC to DG is infinite). In general, the ratio of DC to DG may have any suitable enhanced value following application of the fields (e.g., DC/DG may be greater than 1, may be at least 2, may be at least 3, may be at least 4, may be at least 5, may be 4-10, may be at least 10, may be at least 20, may be at least 35, may be at least 50, etc.). Higher values of ratio DC/DG may increase the number of particles 30 per contact pad during bonding, thereby minimizing bond resistance, and may decrease the presence of particles in gaps 28 to enhance isolation between adjacent contacts 20. This allows pad size and/or gap size to be reduced, so that the density of connections that may be formed when coupling contacts 20 of component 14 to contacts 16 of component 12 may be increased.

Figure 4:
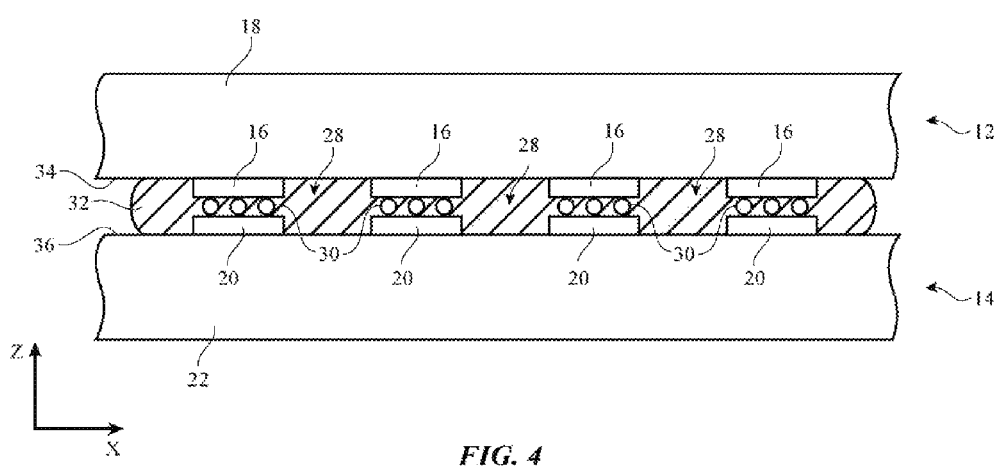
FIG. 4 is a cross-sectional side view of portions of two components that have been bonded together using anisotropic conductive adhesive in accordance with an embodiment.

A cross-sectional side view of components 12 and 14 taken along line 24 of FIG. 1 and viewed in direction 26 is shown in FIG. 4. As shown in FIG. 4, contacts 20 on upper surface 36 of substrate 22 in component 14 may mate with corresponding opposing contacts 16 on opposing lower surface 34 of substrate 18 in component 12. Polymer 32, which may sometimes be referred to as an adhesive layer or polymer layer, may be formed from a thermoset polymer (e.g., epoxy, acrylic, etc.) or may be formed from a thermoplastic polymer. Polymer layer 32 may physically attach substrates 18 and 22 together. Metal or other conductive material in particles 30 may contact metal in contacts 16 and 20 so that each contact 16 is electrically coupled to a corresponding contact 20. This creates vertical conductive paths (paths running parallel to vertical dimension Z) between components 12 and 14. Lateral isolation (along dimension X) is provided by removing most or all of conductive particles 30 from gaps 28.

Interconnects (electrodes) in components 12 and 14 such as contacts 16 and 20 may be formed from a single metal layer, two metal layers, three metal layers, more than three metal layers, alloy layers, elemental metal layers, layers of conductive materials such as carbon nanotubes, layers of other conductive materials, and/or or combinations of these layers.

Figure 5:
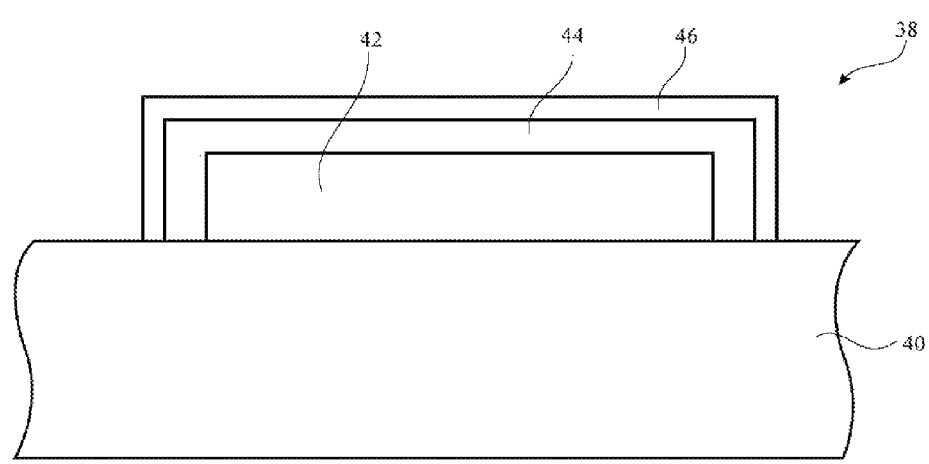
FIG. 5 is a cross-sectional side view of an illustrative contact on a substrate in a component in accordance with an embodiment.

With one illustrative configuration, which is shown in FIG. 5, metal interconnect structures in components 12 and 14 contain multiple layers of metal that are patterned to form contacts, signal lines, and/or other interconnect structures. As shown in FIG. 5, contact 38 may be formed on substrate 40. Contact 38 may be one of contacts 16 and/or one of contacts 20. Substrate 40 may be substrate 22 or substrate 18. Contact 38 may include a high-conductivity layer such as core layer 42. Layer 42 may be formed from a metal such as copper (as an example). Coating layer 44 may be formed on layer 42. Coating layer 44 may enhance corrosion resistance and may be formed from a material such as nickel. The thickness of layer 42 may be less than 4 microns, less than 5 microns, more than 0.4 microns, 0.1-10 microns, or other suitable thickness. The thickness of coating layer 44 may be less than 4 microns, less than 5 microns, more than 0.4 microns, 0.1-10 microns, or other suitable thickness. Outer coating layer 46 may be formed on layer 44 to enhance corrosion resistance and to reduce contact resistance. With one illustrative configuration, outer coating layer 46 may be a layer of gold. The thickness of coating layer 46 may be less than 1 micron, 0.1-2 microns, more than 0.2 microns, less than 1.5 microns, or other suitable thickness.

Figure 6:
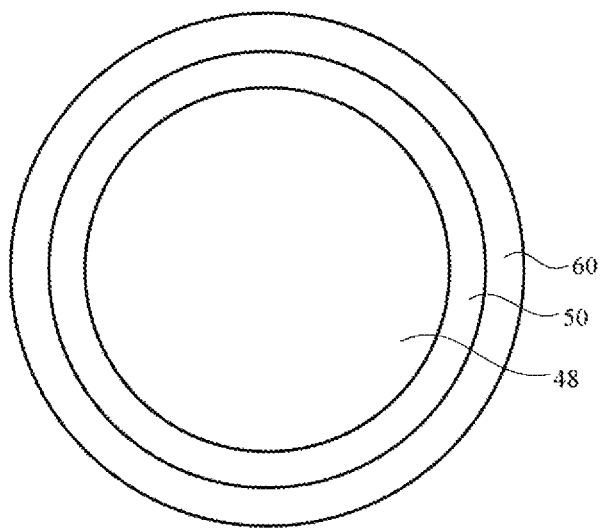
FIG. 6 is a cross-sectional side view of an illustrative conductive particle in accordance with an embodiment.

A cross-sectional side view of an illustrative conductive particle is shown in FIG. 6. In the example of FIG. 6, conductive particle 30 includes core 48, inner coating layer 50, and outer coating layer 60. If desired, conductive particle 30 may include only core 48. Core 48 may be, for example, a particle of conductive material such as metal (e.g., an elemental metal, solder or other metal alloys, etc.). In some configurations, core 48 may be formed from a dielectric such as a polymer that allows particle 30 to be crushed when squeezed between opposing contacts. In this type of arrangement, coating layer 50 may be formed from a conductive material such as metal (e.g., nickel, etc.). Optional layer 60 may be formed from a dielectric such as a polymer and may be used to help prevent particles 30 from being unintentionally shorted to each other within gaps 28.

In general, any suitable configuration may be used for conductive particles 30. The foregoing examples are merely illustrative. Particles 30 may have cores and coatings of any suitable material (metal, dielectric, etc.) and any suitable dimensions. For example, core 48 may have a diameter of 3-10 microns, more than 2 microns, less than 15 microns, 3-7 microns, 5 microns, or other suitable diameter. Coating layer 50 and coating layer 60 may each have a thickness of 0.5 microns, 0.2 to 0.8 microns, more than 0.1 microns, more than 0.3 microns, less than 1 micron, or other suitable thickness.

When the contacts being bonded (e.g., contacts 20) and particles 30 contain magnetic materials such as nickel (e.g., materials that are paramagnetic, superparamagnetic, or ferromagnetic), contacts 20 can concentrate magnetic flux from a source of magnetic field, thereby allowing contacts 20 to attract particles 30. This enhances the density of particles 30 over the contacts. If desired, particles 30 may be statically charged (e.g., with isotropic or anisotropic charging schemes) to allow particles 30 to be attracted to contacts 20 that have been biased to from a static electric field. In other configurations, contacts 20 may be biased with an alternating-current signal and may produce a corresponding alternating-current electric field. This electric field may induce a dipole moment in particles 30 that allows particles 30 to be attracted to contacts 20. If desired, fields may also be applied to contacts 16 to attract particles 30. The application of fields to contacts 20 is merely illustrative.

Figure 7:
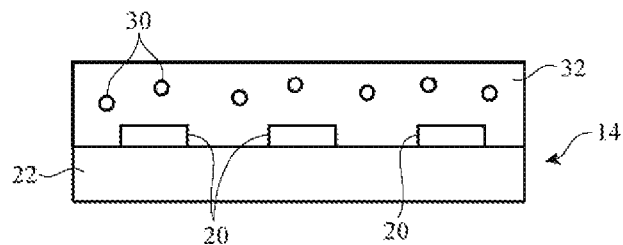
FIGS. 7, 8, and 9 are cross-sectional side views of components being bonded together using illustrative field-assisted anisotropic conductive adhesive bonding techniques in which conductive particles are carried by a polymer material during bonding in accordance with an embodiment.
Figure 8:
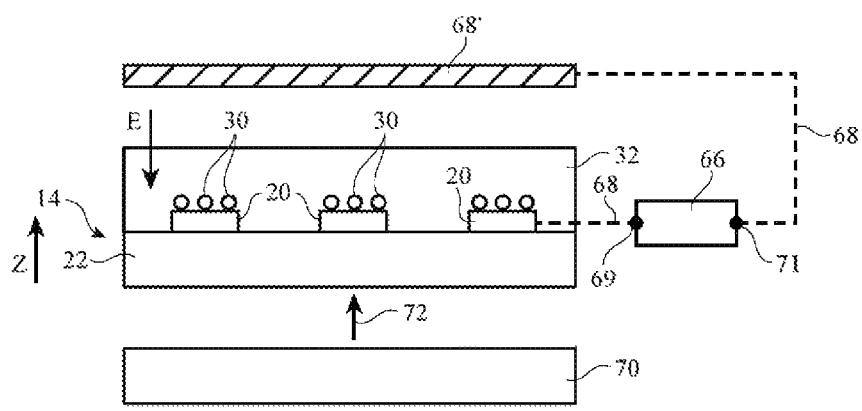
Figure 9:
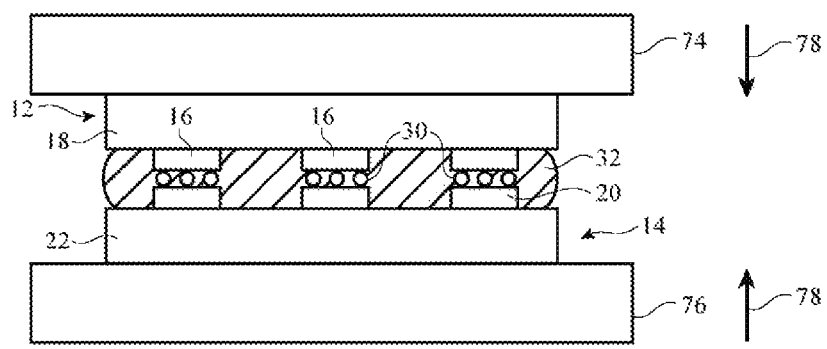

FIGS. 7, 8, and 9 show how particle-concentrating magnetic and/or electric fields may be applied during bonding to concentrate particles 30 on contacts 20. In the example of FIGS. 7, 8, and 9, particles 30 are embedded in polymer 32.

Initially, polymer 32 may be in an uncured liquid state. This allows particles 30 and polymer 32 to be dispensed onto substrate 22 by spraying, printing, dipping, dripping, needle dispensing or other techniques, as shown in FIG. 7. In this state, particles 30 may be suspended within polymer 32 and may be uniformly distributed over the surface of substrate 22.

After applying polymer 32 and suspended particles 30 on substrate 22, particle-concentrating fields may be applied. As shown in FIG. 8, for example, magnetic field source 70 may apply magnetic field 72. Source 70 may be a permanent magnet or electromagnet that generates magnetic field 72.

If desired, signal paths such as path 68 may short contacts 20 to electric field source 66 (e.g., a direct-current signal generator or an alternating-current signal generator) and may couple source 66 to counter electrode 68'. Source 66 may supply a static or alternating-current voltage to contacts 20 that causes contacts 20 to generate a static electric field or an alternating-current electric field (see, e.g., electric field E of FIG. 8).

The fields that are applied using field-producing sources such as sources 70 and 66 of FIG. 8 may attract particles 30 onto contacts 20. For example, magnetic field flux may be concentrated over contacts 20 due to the presence of nickel or other magnetic material in contacts 20. This concentrated magnetic field may attract magnetic material in particles 30, thereby causing particles 30 to become concentrated over contacts 20.

If desired, particles 30 may have a static electric charge that allows particles 30 to be drawn towards a static electric field supplied by contacts 20 when contacts 20 receive a static voltage from source 66. For example, if a negative voltage is applied to terminal 69 and contacts 20 while a positive voltage is applied to terminal 71 and counter electrode 68', electric field E will cause positively charged particles 30 to migrate to contacts 20.

In other configurations, particles 30 may exhibit a polar (dipole) characteristics when exposed to alternating-current fields. This property may induce dielectrophoresis, (the migration of uncharged particles toward a position of maximum field strength in an alternating-current electric field). The application of alternating-current fields to induce dielectrophoresis may be used to cause particles 30 to be attracted to contacts 20.

After concentrating particles 30 in the areas of substrate 22 that overlap contacts 20, the liquid polymer material of polymer 32 may be sandwiched between component 12 and component 14 and cured by application of heat and/or ultraviolet light. As shown in FIG. 9, for example, component 12 may be aligned with component 14 so that each contact 16 in component 12 mates with a corresponding contact 20 in component 14. Once aligned in this way, tool structures 74 and 76 may press inwardly in directions 78 to crush conductive particles 30 between opposing upper and lower contacts. Tool structure 74 and/or tool structure 76 may be heated. The heat from structures 74 and 76 and optional ultraviolet light that is applied to layer 32 may cure the liquid polymer material of polymer layer 32, causing polymer layer 32 to cure, solidify, and attach substrate 18 of component 12 to substrate 22 of component 14.

Figure 10:
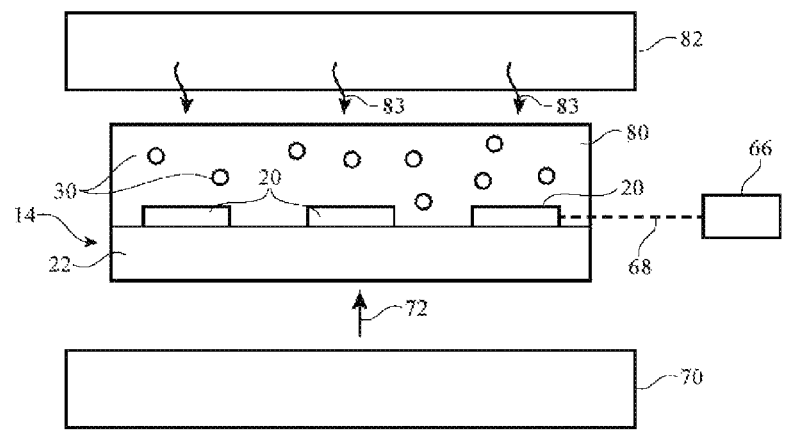
FIGS. 10, 11, and 12 are cross-sectional side views of components being bonded together using illustrative field-assisted anisotropic conductive adhesive bonding techniques in which conductive particles are dispensed in a solvent that is evaporated before using polymer material to finish bonding operations in accordance with an embodiment.
Figure 11:
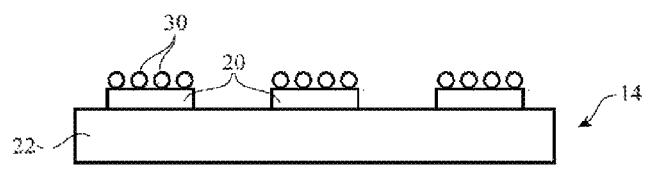
Figure 12:
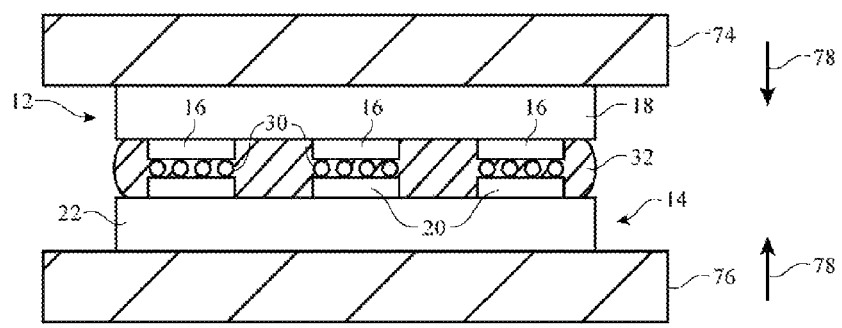

FIGS. 10, 11, and 12 show how particle-concentrating magnetic and/or electric fields may be applied during bonding to concentrate particles 30 on contacts 20 in a configuration in which particles 30 are dispensed in a liquid solvent.

As shown in FIG. 10, liquid solvent 80 may contain suspended conductive particles 30. To concentrate particles 30 on contacts 20, magnetic field source 70 may apply magnetic field 72 and/or signal generator 66 and paths such as path 68 may be used to apply voltages to contacts 20 that cause contacts 20 to produce static and/or alternating-current electric fields. This causes suspended particles 30 to concentrate on contacts 20. After concentrating particle 30 on contacts 20, heat 83 may be applied to solvent 80 by optional heat source 82 (e.g., a lamp, etc.) to evaporate solvent 80 and/or solvent 80 may be evaporated at room temperature. This leaves concentrated particles 30 on contacts 20 and leaves the gaps between contacts 20 free of particles 20 as shown in FIG. 11.

After forming a concentrated layer of particles 30 on contacts 20, polymer 32 may be placed between component 12 and component 14 and components 12 and 14 may be aligned to align contacts 16 with contacts 20, as shown in FIG. 12. Polymer 32 may be applied as a liquid or in solid form. Tool structures 74 and 76 may apply heat to polymer 32. Solid polymer may be melted by the heat and then cooled to solidify the molten polymer to form a bond. Uncured liquid polymer may be cured and solidified by the heat and by optional ultraviolet light. During bonding, tool structures 74 and 76 may be moved in directions 78 to press components 12 and 14 together. Once conductive particles 30 have been crushed between contacts 16 and aligned contacts 20 and after polymer 32 has been cured and solidified, tool structures 74 and 76 may be released.

Figure 13:
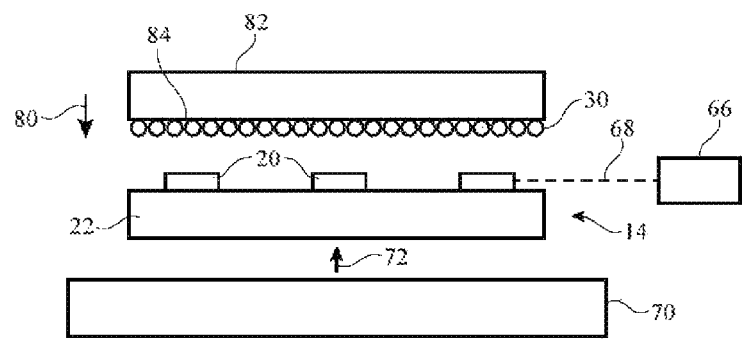
FIGS. 13, 14, and 15 are cross-sectional side views of components being bonded together using an illustrative template transfer technique in accordance with an embodiment.
Figure 14:
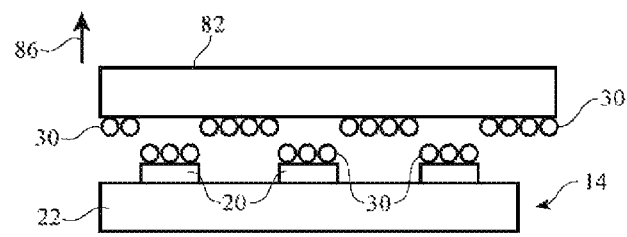
Figure 15:
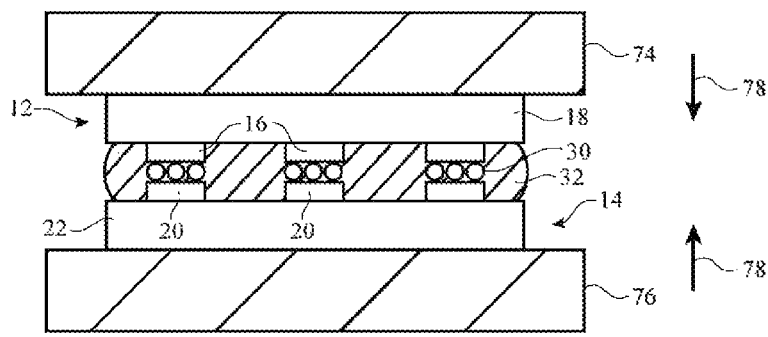

FIGS. 13, 14, and 15 illustrate operations and equipment of the type that may be used to form conductive bonds with a particle template transfer arrangement.

As shown in FIG. 13, surface 84 of particle transfer member 82 may be coated with a layer of conductive particles 30. Member 82 may be a polymer layer (e.g., a layer of polytetrafluoroethylene or other suitable polymer) or may be formed from other materials. Surface 84 may be sticky due to the properties of member 82 (material type, texture, etc.) and/or surface 84 may attract particles 30 through electrostatic attraction, van der Waals attraction, surface tension effects, or other effects. If desired, a thin liquid layer or other layer of material may be applied to surface 84 to increase or decrease the stickiness of surface 84. Particles 30 may be temporarily attached to surface 84 by blowing particles 30 onto surface 84, by pressing surface 84 against a reservoir of particles 30, and/or by otherwise placing particles 30 into contact with surface 84. If desired, particles 30 may be attached to an elastomeric layer or other stretchable substrate which can be stretched laterally to adjust the density of particles 30 that are present. The elastomeric layer may then be pressed against surface Particles 30 may resist sticking to each other so that only a single layer of particles 30 becomes attached to surface 84 (as an example).

After attaching particles 30 to surface 84 of member 82, member 82 may be moved in direction 80 so that particles 30 press against the surfaces of contacts 20. If desired, optional fields (e.g., magnetic fields) may be applied by contacts 20 (e.g., using source 70 to generate magnetic field 72 that is concentrated by contacts 20). Contacts 20 may also be provided with textures, liquid coating layers or other coatings, or other surface treatments that help contacts 20 attract particles 30.

The attraction of particles 30 to the surfaces of contacts 20 after particles 30 are pressed against contacts 20 is preferably greater than the attraction of particles 30 to surface 84 of member 82, so that particles 30 that touch the surfaces of contacts 20 will adhere to the surfaces of contacts 20 and will separate from surface 84 of member 82 as member 82 is retracted in direction 86 as shown in FIG. 14. This process places particles 30 on the surfaces of contacts 20 while leaving the gaps between contacts 20 free of particles 30.

In general, particles 30 may be applied to contacts 20 using magnetic fields or without applying magnetic fields. In scenarios in which particles 30 are transferred to contacts 20 without applying a magnetic field, an appropriate amount of pressure should be applied to transfer particles 30 from surface 84 to contacts 20. Once the applied pressure (pressing member 82 with particles 30 toward contacts 20) is strong enough, particles 30 may be satisfactorily transferred from surface 84 to contacts 20. Care should be taken, however, to ensure that the applied pressure is not too strong, which might cause particles 30 to be transferred to gaps 28. Because of this consideration, pressure-based transfer techniques preferably involve accurate pressure control (short working range). In contrast, arrangements involving the application of magnetic fields may allow for a longer working range because such arrangements do not generally involve the generation of high pressure while pressing particles 30 against the surfaces of contacts 20. Transfer techniques involving pressure-based particle transfer may sometimes be referred to as "hard contact" transfer techniques, whereas transfer techniques involving the use of magnetic fields may sometimes be referred to as "soft contact" transfer techniques.

After coating contacts 20 with particles 30, liquid or solid polymer 32 may be placed between components 12 and 14. As shown in FIG. 15, components 12 and 14 may be aligned so that contacts 16 align with contacts 20. Tool structures 74 and 76 may then be moved in directions 78 while applying heat and optional ultraviolet light to polymer 32. This melts and/or cures uncured liquid polymer 32. Conductive particles 30 are embedded within polymer 32 and are therefore crushed between opposing contacts on substrates 18 and 22 to electrically short the opposing contacts to each other. After cooling, tool structures 74 and 76 may be removed. Polymer 32 may attach components 12 and 14 together while the presence of conductive particles 30 shorts contacts 16 to corresponding contacts 20.

As the examples of FIGS. 7-15 demonstrate, anisotropic conductive adhesive formed from polymer and conductive particles may be used in forming conductive bonds between mating metal contacts. During bond formation, the density of conductive particles overlapping contacts in a component can be enhanced relative to the density of the conductive particles in gaps between the contacts using field-directed assembly techniques (e.g., by applying static and/or alternating-current magnetic fields and/or electric fields to the conductive particles) or by using a transfer member process. Fields may be applied to particles using the contacts while an external source such as a permanent magnet is used to produce a magnetic field and/or a voltage generator is used to generate static and/or alternating current voltages for the contacts that cause the contacts to generate respective static and/or alternating-current electric fields.

The foregoing is merely illustrative and various modifications can be made to the described embodiments. The foregoing embodiments may be implemented individually or in any combination.

What is claimed is:

1. An apparatus, comprising:
   a first component having a first substrate with first metal contacts;
   a second component having a second substrate with second metal contacts;
   a polymer layer that attaches the first and second components together; and
   conductive particles in the polymer layer, wherein the conductive particles have a first density overlapping the first contacts and have a second density overlapping gaps between the first contacts, and wherein the first density divided by the second density is at least five.

2. The apparatus defined in claim 1 wherein each conductive particle includes a dielectric core and a metal coating.

3. The apparatus defined in claim 1 wherein each conductive particle is a solid metal particle.

4. The apparatus defined in claim 1 wherein each of the first contacts includes a magnetic material.

5. The apparatus defined in claim 3 wherein each of the conductive particles includes a magnetic material.

6. The apparatus defined in claim 1 wherein each of the first contacts includes a copper layer and a metal coating on the copper layer.

7. The apparatus defined in claim 6 wherein the each of the first contacts includes a magnetic material and wherein the each of the conductive particles includes a magnetic material.

8. The apparatus defined in claim 7 wherein each of the conductive particles includes a dielectric core and wherein the magnetic material that is included in the conductive particle is a coating on the dielectric core.

9. The apparatus defined in claim 1 wherein the first substrate is a flexible polymer substrate and wherein the second substrate comprises a substrate selected from the group consisting of: a touch sensor substrate and a display substrate.

10. The apparatus defined in claim 9 wherein the first density divided by the second density is at least twenty.

11. The apparatus defined in claim 1 wherein each of the first metal contacts includes a metal material, wherein each of the conductive particles includes a magnetic material, and wherein the magnetic material in each of the first metal contacts is configured to align the conductive particles with the first metal contacts.

12. An apparatus, comprising:
    a first substrate with first contacts;
    a second substrate with second contacts;
    a polymer layer that attaches the first and second substrates together; and
    conductive particles in the polymer layer that short each of the first contacts to a respective one of the second contacts, wherein the conductive particles have a first density overlapping the first contacts and have a second density overlapping gaps between the first contacts and wherein the first density divided by the second density is at least ten.

13. The apparatus defined in claim 12 wherein each conductive particle comprises a conductive particle selected from the group consisting of: a conductive particle that includes a dielectric core and a metal coating and a solid metal particle without a coating.

14. The apparatus defined in claim 12 wherein the each conductive particle comprises a core covered with a metal coating.

15. The apparatus defined in claim 12 wherein the first contacts comprise a magnetic material.

16. The apparatus defined in claim 12 wherein the first substrate comprises a flexible polymer layer and wherein the second substrate comprises a display substrate.

17. The apparatus defined in claim 12 wherein the conductive particles each have at least one conductive layer.

18. The apparatus defined in claim 17 wherein the conductive layer comprises a conductive layer selected from the group consisting of: a magnetic material layer and a dielectric layer.

19. A method for forming an anisotropic conductive adhesive bond between first contacts on a first substrate and respective second contacts on a second substrate, wherein the first contacts include magnetic material, the method comprising:

dispensing a layer of conductive particles that include magnetic material on the first substrate;

concentrating the conductive particles on the first contacts using an electromagnetic field and the magnetic material in the first contacts; and after concentrating the conductive particles, forming a solid polymer layer between the first and second substrates, wherein the solid polymer layer includes the conductive particles, wherein the solid polymer layer attaches the first substrate to the second substrate, and wherein each of the first contacts is shorted to a respective one of the second contacts by a respective portion of the conductive particles.

20. The method defined in claim 19 wherein concentrating the conductive particles comprises generating a magnetic field with a magnet.

21. The method defined in claim 19 wherein concentrating the conductive particles comprises applying a voltage to the first contacts with a signal source and wherein the voltage causes the first contacts to generate an electric field that attracts the conductive particles to the first contacts.

\* \* \* \* \*

UNITED STATES PATENT AND TRADEMARK OFFICE
CERTIFICATE OF CORRECTION

PATENT NO. : 9,942,986 B1
APPLICATION NO. : 15/400677
DATED : April 10, 2018
INVENTOR(S) : Koohee Han et al.

Page 1 of 1

It is certified that error appears in the above-identified patent and that said Letters Patent is hereby corrected as shown below:

In the Specification

Column 6, Line 20, "particles 20" should read -- particles 30 --

Signed and Sealed this
Nineteenth Day of June, 2018

Andrei Iancu
*Director of the United States Patent and Trademark Office*